United States Patent
Farjadrad et al.

(10) Patent No.: US 12,525,540 B1
(45) Date of Patent: Jan. 13, 2026

(54) MULTI-CHIP MODULE (MCM) WITH SCALABLE HIGH BANDWIDTH MEMORY

(71) Applicant: Eliyan Corporation, Santa Clara, CA (US)

(72) Inventors: Ramin Farjadrad, Los Altos, CA (US); Syrus Ziai, Los Altos, CA (US); Curtis McAllister, Los Altos, CA (US); Kevin Donnelly, Santa Cruz, CA (US)

(73) Assignee: Eliyan Corp., Santa Clara, CA (US)

( * ) Notice: Subject to any disclaimer, the term of this patent is extended or adjusted under 35 U.S.C. 154(b) by 71 days.

(21) Appl. No.: 18/374,622

(22) Filed: Sep. 28, 2023

Related U.S. Application Data (63) Continuation-in-part of application No. 18/230,089, filed on Aug. 3, 2023, now Pat. No. 12,182,040.
(Continued)

(51) Int. Cl.
*H01L 23/538* (2006.01)
*H01L 23/498* (2006.01)
(Continued)

(52) U.S. Cl.
CPC .... *H01L 23/5381* (2013.01); *H01L 23/49822* (2013.01); *H01L 23/49838* (2013.01); *H01L 25/0652* (2013.01); *H10B 80/00* (2023.02)

(58) Field of Classification Search
None
See application file for complete search history.

(56) References Cited

U.S. PATENT DOCUMENTS

| 4,334,305 A | 6/1982 | Girardi |
| 5,396,581 A | 3/1995 | Mashiko |

(Continued)

OTHER PUBLICATIONS

"Hot Chips 2017: Intel Deep Dives Into EMIB", TomsHardware.com; Aug. 25, 2017.
(Continued)

*Primary Examiner* — Elias Mamo
(74) *Attorney, Agent, or Firm* — Lance Kreisman; Peninsula Patent Group (57) ABSTRACT

Semiconductor devices, packaging architectures and associated methods are disclosed. In one embodiment, a multi-chip module (MCM) is disclosed. The MCM includes an active silicon substrate and a memory interface circuit configured to support N memory channels. The memory interface circuit has a primary interface for coupling to a host memory interface via the N memory channels. A first HBM stack of memory die is disposed on the active silicon substrate and coupled to a secondary interface of the memory interface circuit. The first HBM stack dedicated to a first subset of the N data channels and a first data transfer rate. A second HBM stack of memory die is disposed on the active silicon substrate. The second HBM stack is positioned inline with the first HBM stack and the memory interface circuit and coupled to the secondary interface of the memory interface circuit. The second HBM stack is dedicated to a second subset of the N data channels and exhibits a second data transfer rate. The first HBM stack and the second HBM stack are configured to collectively support the N channels and exhibit an aggregate data rate that is a sum of the first data rate and the second data rate.

19 Claims, 8 Drawing Sheets

Related U.S. Application Data (60) Provisional application No. 63/471,234, filed on Jun. 5, 2023.

(51) Int. Cl.
   *H01L 25/065* (2023.01)
   *H10B 80/00* (2023.01)

(56) References Cited

U.S. PATENT DOCUMENTS

| | | |
|---|---|---|
| 5,677,569 A | 10/1997 | Choi |
| 5,892,287 A | 4/1999 | Hoffman |
| 5,910,010 A | 6/1999 | Nishizawa |
| 6,031,729 A | 2/2000 | Berkely |
| 6,055,235 A | 4/2000 | Blanc |
| 6,417,737 B1 | 7/2002 | Moloudi |
| 6,690,742 B2 | 2/2004 | Chan |
| 6,721,313 B1 | 4/2004 | Van Duyne |
| 6,932,618 B1 | 8/2005 | Nelson |
| 7,027,529 B1 | 4/2006 | Ohishi |
| 7,248,890 B1 | 7/2007 | Raghavan |
| 7,269,212 B1 | 9/2007 | Chau |
| 7,477,615 B2 | 1/2009 | Oshita |
| 7,535,958 B2 | 5/2009 | Best |
| 7,701,957 B1 | 4/2010 | Bicknell |
| 7,907,469 B2 | 3/2011 | Sohn et al. |
| 7,978,754 B2 | 7/2011 | Yeung |
| 8,004,330 B1 | 8/2011 | Acimovic |
| 8,024,142 B1 | 9/2011 | Gagnon |
| 8,121,541 B2 | 2/2012 | Rofougaran |
| 8,176,238 B2 | 5/2012 | Yu et al. |
| 8,483,579 B2 | 7/2013 | Fukuda |
| 8,546,955 B1 | 10/2013 | Wu |
| 8,704,364 B2 | 4/2014 | Banijamali et al. |
| 8,861,573 B2 | 10/2014 | Chu |
| 8,948,203 B1 | 2/2015 | Nolan |
| 8,982,905 B2 | 3/2015 | Kamble |
| 9,088,334 B2 | 7/2015 | Chakraborty |
| 9,106,229 B1 | 8/2015 | Hutton |
| 9,129,935 B1 | 9/2015 | Chandrasekar |
| 9,294,313 B2 | 3/2016 | Prokop |
| 9,349,707 B1 | 5/2016 | Sun |
| 9,379,878 B1 | 6/2016 | Lugthart |
| 9,432,298 B1 | 8/2016 | Smith |
| 9,832,006 B1 | 11/2017 | Bandi |
| 9,886,275 B1 | 2/2018 | Carlson |
| 9,934,842 B2 * | 4/2018 | Mozak ............... G06F 13/1689 |
| 9,961,812 B2 | 5/2018 | Suorsa |
| 10,171,115 B1 | 1/2019 | Shirinfar |
| 10,402,363 B2 | 9/2019 | Long et al. |
| 10,410,694 B1 | 9/2019 | Arbel |
| 10,439,661 B1 | 10/2019 | Heydari |
| 10,496,561 B2 * | 12/2019 | Roberts ............... G06F 13/161 |
| 10,545,860 B2 * | 1/2020 | Malladi ............... H01L 25/0655 |
| 10,642,767 B1 | 5/2020 | Farjadrad |
| 10,678,738 B2 | 6/2020 | Dai |
| 10,735,176 B1 | 8/2020 | Heydari |
| 10,748,852 B1 | 8/2020 | Sauter |
| 10,803,548 B2 | 10/2020 | Matam et al. |
| 10,804,204 B2 | 10/2020 | Rubin et al. |
| 10,855,498 B1 | 12/2020 | Farjadrad |
| 10,916,516 B2 * | 2/2021 | Newman ............... H01L 24/14 |
| 10,935,593 B2 | 3/2021 | Goyal |
| 11,088,876 B1 | 8/2021 | Farjadrad |
| 11,100,028 B1 | 8/2021 | Subramaniam |
| 11,164,817 B2 | 11/2021 | Rubin et al. |
| 11,204,863 B2 | 12/2021 | Sheffler |
| 11,782,865 B1 | 10/2023 | Kochavi |
| 11,789,649 B2 | 10/2023 | Chatterjee et al. |
| 11,841,815 B1 | 12/2023 | Farjadrad |
| 11,842,986 B1 | 12/2023 | Farjadrad |
| 11,855,043 B1 | 12/2023 | Farjadrad |
| 11,855,056 B1 | 12/2023 | Rad |
| 11,892,242 B2 | 2/2024 | Mao |
| 11,893,242 B1 | 2/2024 | Farjadrad |
| 11,983,125 B2 | 5/2024 | Soni |
| 12,001,355 B1 | 6/2024 | Dreier |
| 12,001,725 B2 | 6/2024 | Chatterjee |
| 2002/0122479 A1 | 9/2002 | Agazzi |
| 2002/0136315 A1 | 9/2002 | Chan |
| 2004/0088444 A1 | 5/2004 | Baumer |
| 2004/0113239 A1 | 6/2004 | Prokofiev |
| 2004/0130347 A1 | 7/2004 | Moll |
| 2004/0156461 A1 | 8/2004 | Agazzi |
| 2005/0041683 A1 | 2/2005 | Kizer |
| 2005/0134306 A1 | 6/2005 | Stojanovic |
| 2005/0157781 A1 | 7/2005 | Ho |
| 2005/0205983 A1 | 9/2005 | Origasa |
| 2006/0060376 A1 | 3/2006 | Yoon |
| 2006/0103011 A1 | 5/2006 | Andry |
| 2006/0158229 A1 | 7/2006 | Hsu |
| 2006/0181283 A1 | 8/2006 | Wajcer |
| 2006/0188043 A1 | 8/2006 | Zerbe |
| 2006/0250985 A1 | 11/2006 | Baumer |
| 2006/0251194 A1 | 11/2006 | Bublil |
| 2007/0281643 A1 | 12/2007 | Kawai |
| 2008/0063395 A1 | 3/2008 | Royle |
| 2008/0143422 A1 | 6/2008 | Lalithambika |
| 2008/0186987 A1 | 8/2008 | Baumer |
| 2008/0222407 A1 | 9/2008 | Carpenter |
| 2009/0113158 A1 | 4/2009 | Schnell |
| 2009/0154365 A1 | 6/2009 | Diab |
| 2009/0174448 A1 | 7/2009 | Zabinski |
| 2009/0220240 A1 | 9/2009 | Abhari |
| 2009/0225900 A1 | 9/2009 | Yamaguchi |
| 2009/0304054 A1 | 12/2009 | Tonietto |
| 2010/0177841 A1 | 7/2010 | Yoon |
| 2010/0197231 A1 | 8/2010 | Kenington |
| 2010/0294547 A1 | 11/2010 | Hatanaka |
| 2011/0029803 A1 | 2/2011 | Redman-White |
| 2011/0038286 A1 | 2/2011 | Ta |
| 2011/0167297 A1 | 7/2011 | Su |
| 2011/0187430 A1 | 8/2011 | Tang |
| 2011/0204428 A1 | 8/2011 | Erickson |
| 2011/0267073 A1 | 11/2011 | Chengson |
| 2011/0293041 A1 | 12/2011 | Luo |
| 2012/0082194 A1 | 4/2012 | Tam |
| 2012/0182776 A1 | 7/2012 | Best |
| 2012/0192023 A1 | 7/2012 | Lee |
| 2012/0216084 A1 | 8/2012 | Chun |
| 2012/0327818 A1 | 12/2012 | Takatori |
| 2013/0181257 A1 | 7/2013 | Ngai |
| 2013/0222026 A1 | 8/2013 | Havens |
| 2013/0249290 A1 | 9/2013 | Buonpane |
| 2013/0285584 A1 | 10/2013 | Kim |
| 2014/0016524 A1 | 1/2014 | Choi |
| 2014/0048947 A1 | 2/2014 | Lee |
| 2014/0126613 A1 | 5/2014 | Zhang |
| 2014/0192583 A1 | 7/2014 | Rajan |
| 2014/0269860 A1 | 9/2014 | Brown |
| 2014/0269983 A1 | 9/2014 | Baeckler |
| 2015/0012677 A1 | 1/2015 | Nagarajan |
| 2015/0172040 A1 | 6/2015 | Pelekhaty |
| 2015/0180760 A1 | 6/2015 | Rickard |
| 2015/0206867 A1 | 7/2015 | Lim |
| 2015/0271074 A1 | 9/2015 | Hirth |
| 2015/0326348 A1 | 11/2015 | Shen |
| 2015/0358005 A1 | 12/2015 | Chen |
| 2016/0056125 A1 | 2/2016 | Pan |
| 2016/0071818 A1 | 3/2016 | Wang |
| 2016/0111406 A1 | 4/2016 | Mak |
| 2016/0217872 A1 | 7/2016 | Hossain |
| 2016/0294585 A1 | 10/2016 | Rahman |
| 2017/0286340 A1 | 10/2017 | Ngo |
| 2017/0317859 A1 | 11/2017 | Hormati |
| 2017/0331651 A1 | 11/2017 | Suzuki |
| 2018/0010329 A1 | 1/2018 | Golding, Jr. |
| 2018/0082981 A1 | 3/2018 | Gowda |
| 2018/0137005 A1 * | 5/2018 | Wu ............... G11C 7/10 |
| 2018/0175001 A1 | 6/2018 | Pyo |
| 2018/0190635 A1 | 7/2018 | Choi |
| 2018/0196767 A1 | 7/2018 | Linstadt |
| 2018/0210830 A1 | 7/2018 | Malladi et al. |
| 2018/0315735 A1 | 11/2018 | Delacruz |

(56) References Cited

U.S. PATENT DOCUMENTS

| | | |
|---|---|---|
| 2019/0044764 A1 | 2/2019 | Hollis |
| 2019/0058457 A1 | 2/2019 | Ran |
| 2019/0108111 A1 | 4/2019 | Levin |
| 2019/0198489 A1 | 6/2019 | Kim |
| 2019/0267062 A1 | 8/2019 | Tan |
| 2019/0319626 A1 | 10/2019 | Dabral |
| 2020/0051961 A1 | 2/2020 | Rickard |
| 2020/0105718 A1 | 4/2020 | Collins et al. |
| 2020/0257619 A1 | 8/2020 | Sheffler |
| 2020/0320026 A1 | 10/2020 | Kabiry |
| 2020/0364142 A1 | 11/2020 | Lin |
| 2020/0373286 A1 | 11/2020 | Dennis |
| 2021/0056058 A1 | 2/2021 | Lee |
| 2021/0082875 A1 | 3/2021 | Nelson |
| 2021/0117102 A1 | 4/2021 | Grenier |
| 2021/0181974 A1 | 6/2021 | Ghosh |
| 2021/0183842 A1 | 6/2021 | Fay |
| 2021/0193567 A1 | 6/2021 | Cheah et al. |
| 2021/0225827 A1 | 7/2021 | Lanka |
| 2021/0258078 A1 | 8/2021 | Meade |
| 2021/0311900 A1 | 10/2021 | Malladi |
| 2021/0365203 A1 | 11/2021 | O |
| 2021/0405919 A1 | 12/2021 | K |
| 2022/0051989 A1 | 2/2022 | Agarwal |
| 2022/0159860 A1 | 5/2022 | Winzer |
| 2022/0223522 A1 | 7/2022 | Scearce |
| 2022/0350756 A1 | 11/2022 | Burstein |
| 2022/0391114 A1 | 12/2022 | Richter |
| 2023/0039033 A1 | 2/2023 | Zarkovsky |
| 2023/0068802 A1 | 3/2023 | Wang |
| 2023/0090061 A1 | 3/2023 | Zarkovsky |
| 2023/0181599 A1 | 6/2023 | Du et al. |
| 2023/0289311 A1 | 9/2023 | Noguera Serra |
| 2024/0007234 A1 | 1/2024 | Harrington |
| 2024/0028208 A1 | 1/2024 | Kim |
| 2024/0241840 A1 | 7/2024 | Im |
| 2024/0403235 A1* | 12/2024 | Ali ...................... G06F 13/4022 |

OTHER PUBLICATIONS

"Using Chiplet Encapsulation Technology to Achieve Processing-In-Memory Functions"; Micromachines 2022, 13, 1790; https://www.mdpi.com/journal/micromachines; Tian et al.

"Multiport memory for high-speed interprocessor communication in MultiCom;" Scientia Iranica, vol. 8, No. 4, pp. 322-331; Sharif University of Technology, Oct. 2001; Asgari et al.

Farjadrad et al., "A Bunch of Wires (BOW) Interface for Inter-Chiplet Communication", 2019 IEEE Symposium on High-Performance Interconnects (HOTI), pp. 27-30, Oct. 2019.

Universal Chiplet Interconnect Express (UCIe) Specification Rev. 1.0, Feb. 24, 2022.

Universal Chiplet Interconnect Express (UCIe) Specification, Revision 1.1, Version 1.0, Jul. 10, 2023.

Hybrid Memory Cube Specification 2.1, Hybrid Memory Cube Consortium, HMC-30G-VSR PHY, 2014.

Block Memory Generator v8.2 LogiCORE IP Product Guide Vivado Design Suite; Xilinx; Apr. 1, 2015.

Kurt Lender et al., "Questions from the Compute Express Link Exploring Coherent Memory and Innovative Cases Webinar", Apr. 13, 2020, CXL consortium.

Planet Analog, "The basics of SerDes (serializers/deserializers) for interfacing", Dec. 1, 2020, Planet Analog.

* cited by examiner

MULTI-CHIP MODULE (MCM) WITH SCALABLE HIGH BANDWIDTH MEMORY

CROSS-REFERENCE TO RELATED APPLICATIONS

This application is a Continuation-In-Part which claims priority to U.S. application Ser. No. 18/230,089, filed Aug. 3, 2023, titled MULTI-CHIP MODULE (MCM) WITH SCALABLE HIGH BANDWIDTH MEMORY, which is a Non-Provisional which claims priority to U.S. Provisional Application No. 63/471,234, filed Jun. 5, 2023, titled HBM3 TO HBM4 MIGRATION METHOD, which is incorporated herein by reference in its entirety.

TECHNICAL FIELD

The disclosure herein relates to semiconductor devices, packaging and associated methods.

BACKGROUND

As integrated circuit (IC) chips such as system on chips (SoCs) become larger, the yields realized in manufacturing the chips become smaller. Decreasing yields for larger chips increases overall costs for chip manufacturers. To address the yield problem, chiplet architectures have been proposed that favor a modular approach to SoCs. The solution employs smaller sub-processing chips, each containing a well-defined subset of functionality. Chiplets thus allow for dividing a complex design, such as a high-end processor or networking chip, into several small die instead of one large monolithic die.

One form of memory technology that is employed in certain chiplet-based SoC applications is High Bandwidth Memory (HBM), which has multiple generations that have been standardized by the Joint Electron Device Engineering Council (JEDEC). Each iteration of the standard often involves significant industry investment in packaging infrastructure to support increased channel count, bandwidth, and performance. Transitioning from a legacy HBM standard to a next generation standard may also prove problematic due to uncertain scheduling for the production of new memory technology, often resulting in device availability being relegated to lower frequency bins for indeterminate periods of time. Thus, migrating from one HBM standard to a next generation HBM standard in a chiplet-based multi-chip module (MCM) is typically a costly endeavor.

What is needed is an efficient, robust and cost-efficient way to incorporate next-generation HBM devices into a chiplet architecture.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Semiconductor devices, packaging architectures and associated methods are disclosed. In one embodiment, a multi-chip module (MCM) is disclosed that includes a package substrate and an integrated circuit (IC) processor chip disposed on the package substrate. The IC processor chip includes a data interface configured to support N channels. A scalable high bandwidth memory (HBM) is coupled to the IC processor chip. The scalable HBM includes a first HBM device disposed on the package substrate with a first primary data interface that supports a first set of N/2 data channels and a first data transfer rate. A second HBM device is disposed on the package substrate and supports a second set of N/2 data channels and a second data transfer rate. The first HBM device and the second HBM device are configured to collectively support the full N channels and an aggregate data rate that is a sum of the first data rate and the second data rate. By incorporating a scalable HBM memory with individual devices that support less than the total number of desired channels, legacy devices may be employed and configured to collectively provide the total number of desired channels. This may allow for a less-costly migration between the use of legacy HBM devices and next generation HBM devices.

Figure 1:
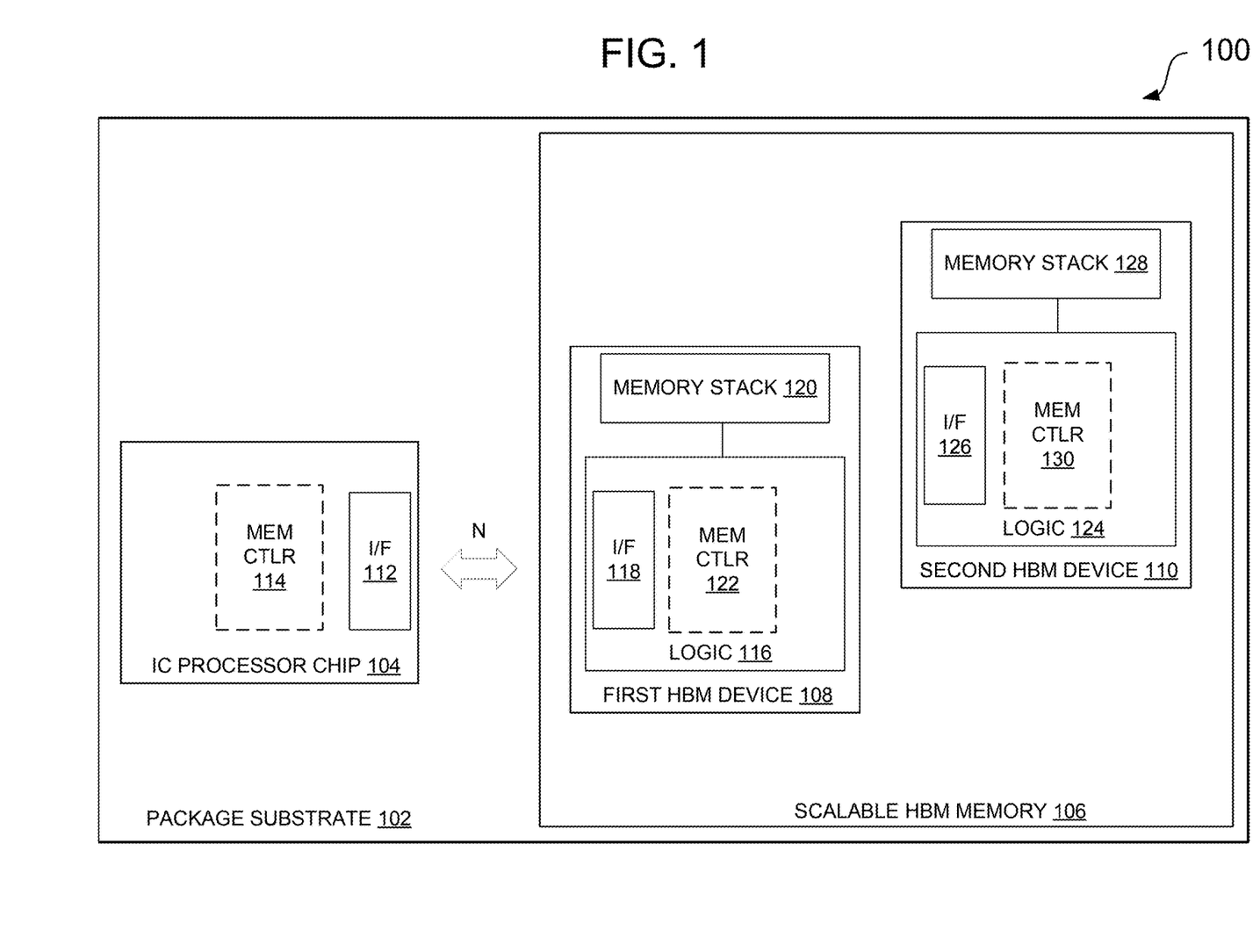
FIG. 1 illustrates a high-level generic embodiment of an MCM that employs a scalable HBM memory suitable for HBM device migration between device generations.

Throughout the disclosure provided herein, the term multi-chip module (MCM) is used to represent a semiconductor device that incorporates multiple semiconductor die or sub-packages in a single unitary package. An MCM may also be referred to as a system in a chip (SiP). With reference to FIG. 1, a block diagram of one embodiment of a multi-chip module (MCM) is shown, generally designated 100. For one embodiment, the MCM 100 includes a package substrate 102. The package substrate forms a support surface and signal routing vehicle for multiple integrated circuit (IC) chips, or chiplets, including an IC processor chip 104, and a scalable high bandwidth memory (HBM) 106. For one embodiment, the scalable HBM memory 106 includes at least a first high-bandwidth memory (HBM) device 108 and a second HBM device 110. Depending on the application, the package substrate 102 for any of the embodiments shown in FIGS. 1 through 8 may take on one of various forms that more fully described below, such as a low-cost non-silicon substrate, a passive interposer or an active silicon interposer, a silicon bridge, a redistribution layer (RDL) or a combination of the preceding forms, to name but a few.

With continued reference to FIG. 1, for one embodiment, the IC processor chip 104 takes the form of a computing resource such as a computer processing unit (CPU), graphics processing unit (GPU), or artificial intelligence processing unit. The IC processor chip 104 acts as a host device that periodically accesses the memory resources provided by the scalable HBM 106. A host memory interface 112 is provided on the IC processor chip 104 that supports a set of N independent channels. For one specific embodiment, the host memory interface 112 includes input/output (I/O) circuitry resources that are sufficient to form a set of thirty-two independent memory channels that operate at a collective data rate or bandwidth (BW). The host memory interface 112 also includes a communications interface that defines a host node for communicating with similar circuitry on the first and second HBM devices 108 and 110. For some embodiments, the IC processor chip 104 includes an HBM memory controller 114 to control transfers between core circuitry of the IC processor chip 104 and the scalable HBM memory 106. In other embodiments, the IC processor chip 104 may omit an HBM memory controller, with such functionality being incorporated into the HBM devices 108 and 110 of the scalable HBM memory 106.

Further referring to FIG. 1, for one embodiment, the first HBM device 108 takes the form of a DRAM memory device compliant with a given High Bandwidth Memory (HBM) standard, such as HBM3. The first HBM device 108 includes HBM logic 116 that may take the form of a logic base die or a portion of an active silicon substrate, such as that described more fully below with respect to FIG. 7. Depending on the topology employed by the scalable HBM memory 106, the HBM logic 116 includes a device memory interface 118 that includes device I/O circuitry that interfaces with at least a subset, such as N/2, of the set of the N memory channels provided by the host memory interface 112, and operating at a collective bandwidth of BW/2. Different topologies that incorporate different device interfaces are described more fully below. A stack of dynamic random access memory (DRAM) die 120 is vertically disposed on the HBM logic 116 and interconnected to the logic by, for example, through-silicon vias (TSVs). For embodiments where the IC processor chip 104 omits an HBM memory controller, the HBM logic 116 of the first HBM device 108 may also optionally include an on-chip HBM memory controller 122 to control transfers between the core circuitry of the IC processor chip 104 and the stack of DRAM die 120 of the first HBM device 108.

With continued reference to FIG. 1, the second HBM device 110 is formed similar to the first HBM device 108, including HBM logic 124 that may take the form of a second logic die or a second portion of an active silicon substrate, described more fully below. The HBM logic 124 includes a second device memory interface 126 that includes device I/O circuitry that interfaces with at least a second subset, such as N/2, of the set of the N memory channels provided by the host memory interface 112, and also operating at a collective bandwidth of BW/2. A second stack of dynamic random access memory (DRAM) die 128 is vertically disposed on and interconnected to the HBM logic 124. For embodiments where the IC processor chip 104 omits an HBM memory controller, the HBM logic 124 of the second HBM device 110 may also optionally include an on-chip HBM memory controller 130 to control transfers between the core circuitry of the IC processor chip 104 and the second stack of DRAM die 128 of the second HBM device 110.

Further referring to FIG. 1, the scalable HBM memory 106 may be configured in a variety of ways to suit various applications. Various embodiments for different topologies, such as daisy-chained and point-to-point architectures are described below and shown in FIGS. 2 through 7. At a high level, the first HBM device 108 and the second HBM device 110 are configured to collectively support the N independent channels and an aggregate data rate or bandwidth BW that matches the bandwidth provided by the HBM host memory interface 112. As a result, infrastructure for a next-generation HBM device that may incorporate an integer multiple number of channels and a similar expansion of memory bandwidth over a legacy HBM device may be developed and used with a unique configuration of multiple legacy HBM devices.

Figure 2:
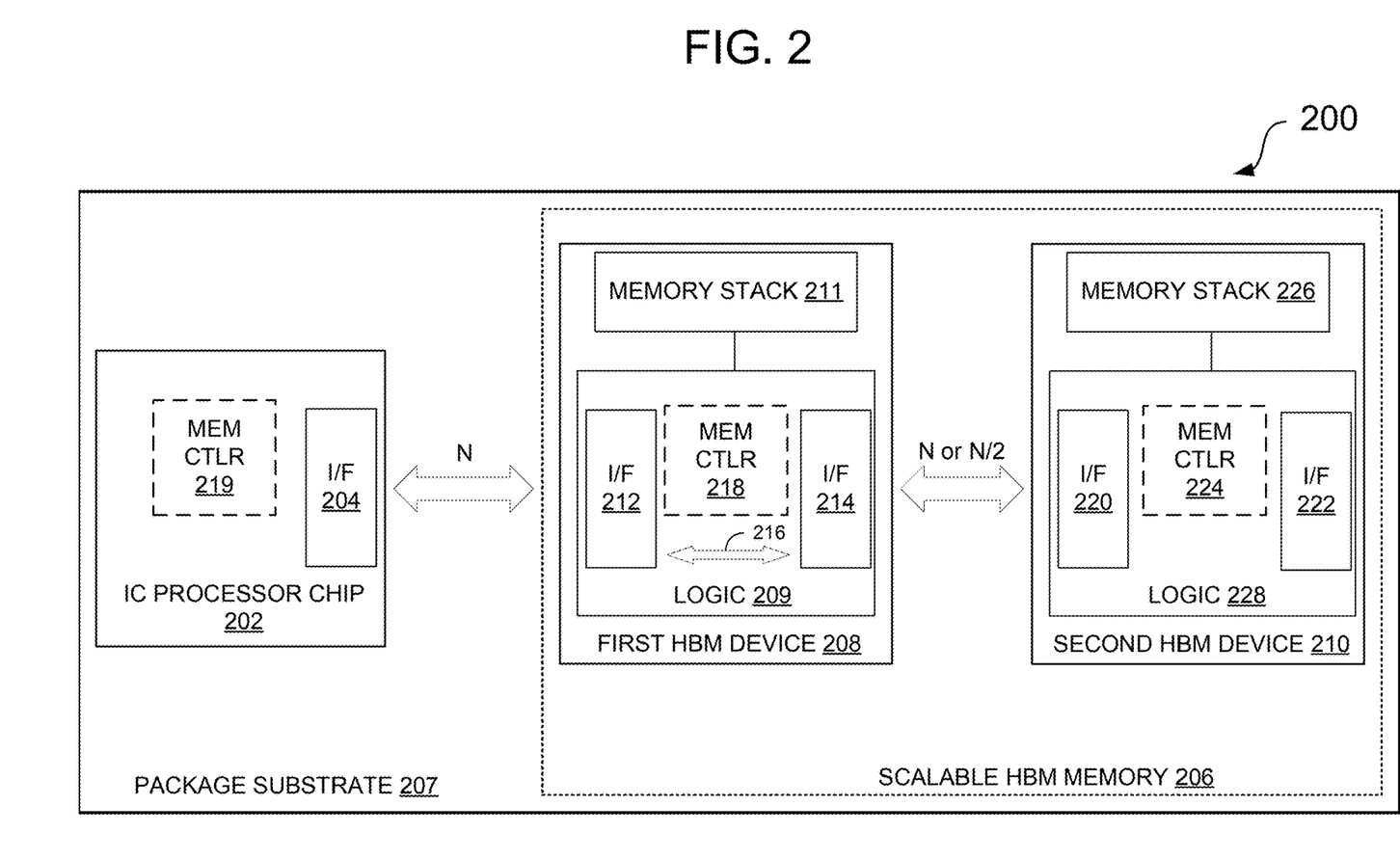
FIG. 2 illustrates one specific embodiment of the MCM of FIG. 1, employing a daisy-chained architecture.

While FIG. 1 illustrates a generic architecture for an HBM migration scheme, FIG. 2 illustrates one specific embodiment of the generic architecture by incorporating a daisy-chained topology for an MCM 200 using HBM memory devices similar to those described above. The MCM 200 includes an IC processor chip 202 that includes a host memory interface 204 that supports N channels and exhibits a collective bandwidth BW. A scalable HBM memory 206 is coupled to the IC processor chip 202 and provides respective first and second HBM devices 208 and 210 that are configured to be accessed, and where all memory-related signals to and from the second HBM device 210 run through and are retransmitted by the first HBM device 208. Each memory transaction (read or write) from the IC processor chip 202 is bound for one memory array on one of die memory stacks. If the first HBM device 208 determines the transaction is bound for its memory stack, it need not forward the transaction to the second HBM device 210.

With continued reference to FIG. 2, the IC processor chip 202 and the first and second HBM devices 208 and 210 of the scalable HBM memory 206 may be disposed on a package substrate 207 that takes one of a variety of forms, depending on the application. As one example, the various chips may be mounted on a low-cost non-silicon substrate, a passive interposer, an active silicon interposer, a silicon bridge, or combination of the above.

Further referring to FIG. 2, for one embodiment, the first HBM device 208 includes logic 209 in the form of an HBM base die that is stacked with a plurality of DRAM die 211. The logic 209 employs a first primary device interface 212 that matches the channel count N of the host memory interface 204 of the IC processor chip 202. For one specific embodiment that uses legacy HBM devices in the scalable HBM memory 206, an integer number of legacy HBM device interface circuits, each supporting N/2 channels, may be combined or unified to form the primary device interface 212 for the first HBM device 208 to support the N channels.

With continued reference to FIG. 2, to communicate with the second HBM device 210, the first HBM device 208 employs a second port or secondary device interface 214 that may, as an example, support N or N/2 channels, depending on the application. Communications circuitry 216, forming a portion of the overall switch fabric employed throughout the MCM 200, interconnects the secondary device interface 214 to at least a portion of the primary device interface 212. For one embodiment, the communications circuitry 216 may employ multiplexing circuitry to select which portions of the N channels are passed to and from the first HBM device 208 and the second HBM device 210. In other situations, the communications circuitry 216 may take the form of in-memory processing circuitry, similar to network-on-chip (NoC) circuitry discussed in U.S. patent application Ser. No. 17/994,123, titled "MULTI-CHIP MODULE (MCM) WITH MULTI-PORT UNIFIED MEMORY, filed Nov. 25, 2022, and incorporated by reference herein in its entirety.

In some embodiments, the first HBM device 208 includes an on-chip memory controller 218 that interacts with a portion of the primary device interface 212, such as a first set of N/2 channels, to facilitate transfers between the IC processor chip 202 and the stack of DRAM die 211. A second set of the N/2 channels bypasses the first on-chip memory controller 218 and is routed on-chip to the secondary device interface 214 via the communications circuitry 216. In some circumstances, the first on-chip memory controller 218 may be omitted from the first HBM device 208, and instead a host memory controller 219 may be incorporated on the IC processor chip 202. For some embodiments, where the memory controller is omitted from the first HBM device, buffer circuitry (not shown) may be provided.

Further referring to FIG. 2, the second HBM device 210 is formed similar to the first HBM device 208, such as a replica of the first HBM device, and includes a second logic base die 228 that incorporates a second primary interface 220, and an unused second secondary interface 222. For some embodiments, the second primary and secondary interfaces 220 and 222 may include circuitry to support a same number of channels as those supported by the first primary and secondary interface circuits 212 and 214 of the first HBM device 208. In other embodiments, the second primary and secondary interfaces 220 and 222 may include circuitry to support half the number of channels as those supported by the first primary and secondary interface circuits 212 and 214 of the first HBM device 208. Depending on the application, the second HBM device 210 may or may not include an on-chip memory controller, such as at 224 to facilitate transfers between the IC processor chip 202 and a second stack of DRAM die 226 that is stacked atop the second logic base die 228.

In operation, the MCM 200 provides the infrastructure and resources to support operating N independent memory channels with a scalable HBM memory that utilizes HBM devices that separately support N/2 channels, albeit in a daisy-chained architecture. One specific example involves providing a total of thirty-two channels—with sixteen of the channels provided by the first HBM device 208, and the other sixteen channels provided in a daisy-chained manner by the second HBM device 210 via the on-chip retransmitting/repeating feature provided by the first HBM device 208. Additionally, by coordinating memory accesses to the first and second HBM devices in a concurrent manner, where both of the HBM devices 208 and 210 are accessed during respective time intervals that at least partially overlap, the aggregate memory bandwidth of the scalable HBM memory 206 for the thirty-two channels may be doubled in comparison to what the bandwidth would be for sixteen channels.

Figure 3:
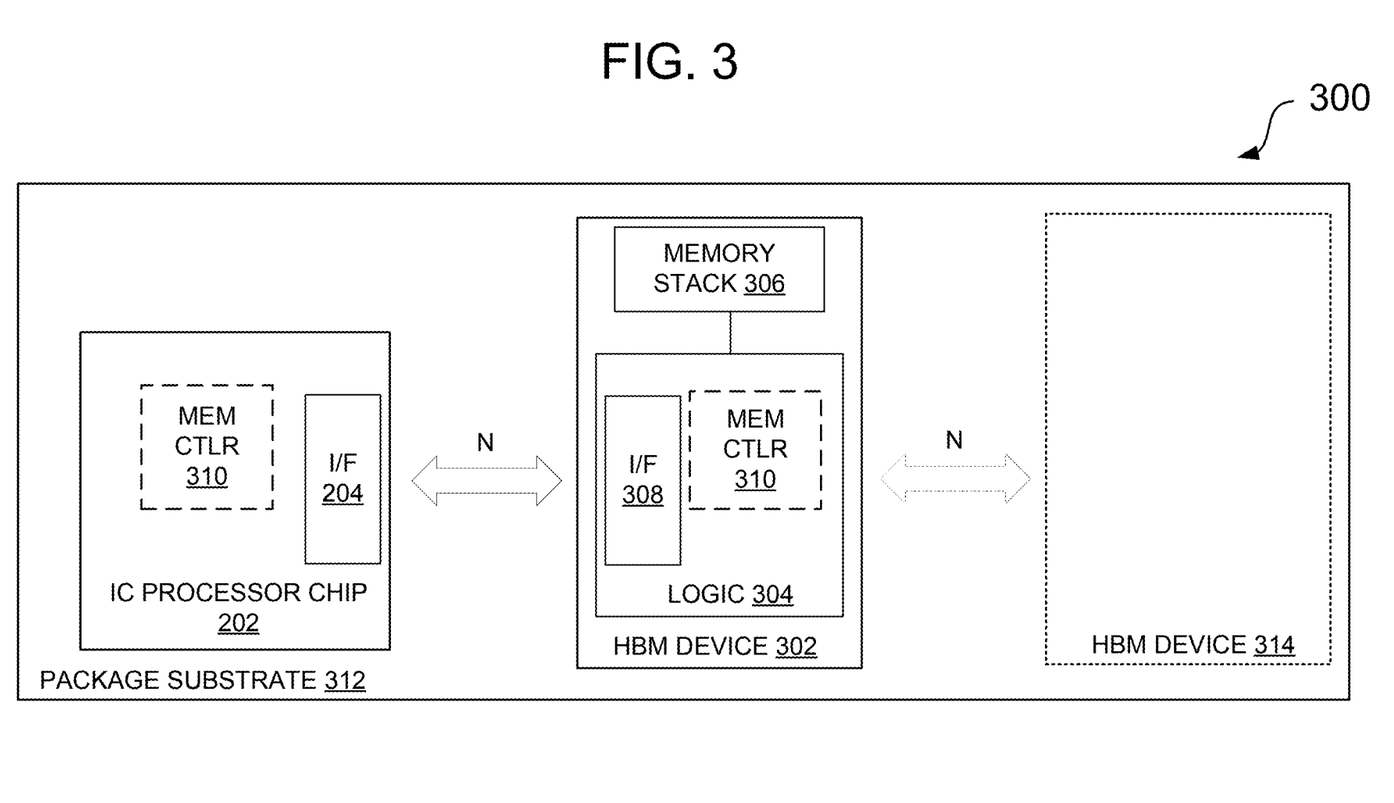
FIG. 3 illustrates an MCM with an IC processor device, such as that employed in FIG. 2, redeployed to support a next generation HBM device.

While FIG. 2 illustrates one embodiment of an MCM that utilizes a scalable HBM memory 206 that supports N channels in a legacy mode of operation using legacy devices, such as HBM3 devices, that each support N/2 channels, FIG. 3 illustrates an embodiment of an MCM 300 that supports a next generation mode of operation by reusing much of the infrastructure designed to support interoperability between, for example, the IC processor chip 202 and the scalable HBM memory 206 of FIG. 2. However, instead of employing the scalable HBM memory 206, a next generation HBM memory device 302 that individually supports N channels may be substituted as the HBM memory resource. The next generation HBM device 302 would be expected to be similar to prior generation devices, with a logic base die 304 that is coupled to a stack of memory die 306. The logic base die 304 would include a full N-channel device interface 308 to generally match the N-channel host interface 204 of the IC processor chip 202. A memory controller 1210 may optionally be included in the logic base die 304, unless it is incorporated in the IC processor chip 202. For some embodiments, additional capacity in the form of an additional next generation HBM device 314 may be provided in a daisy-chained manner, where the first HBM device 304 includes NoC circuitry to manage traffic between the two next generation HBM devices 302 and 314. The reused infrastructure and the additional capacity option may be employed in any of the MCM embodiments described herein, such as those shown in FIGS. 2, and 4-7.

Further referring to FIG. 3, the IC processor chip 202 may retain and reuse much of the infrastructure provided in supporting the legacy mode of operation, such as that shown in FIG. 2, thus reducing the costs and time typically involved in migrating from legacy memory devices to next generation devices. Programmable logic (not shown) in the IC processor chip 202 may be updated during MCM manufacture or during initialization to configure the IC processor chip 202 to operate in the legacy mode or the next generation mode. While the discussion above notes the reusability of a same IC processor chip 202 for both MCM embodiments 200 and 300, for some embodiments, the IC processor chip 202 employed in the MCM 300 may incorporate slight modifications that may be accomplished with far lower cost than a full redesign to support a next generation HBM architecture.

For some embodiments, the IC processor chip 202 employs unique interface circuitry that allows for the use of high-performance links that are compatible with a cost-efficient standard organic build-up package substrate, such as at 312. Such interface circuitry and associated links are disclosed in U.S. patent application Ser. No. 18/092,647, filed Jan. 3, 2023, titled "CHIPLET GEARBOX FOR LOW-COST MULTI-CHIP MODULE APPLICATIONS", and incorporated by reference in its entirety.

Figure 4:
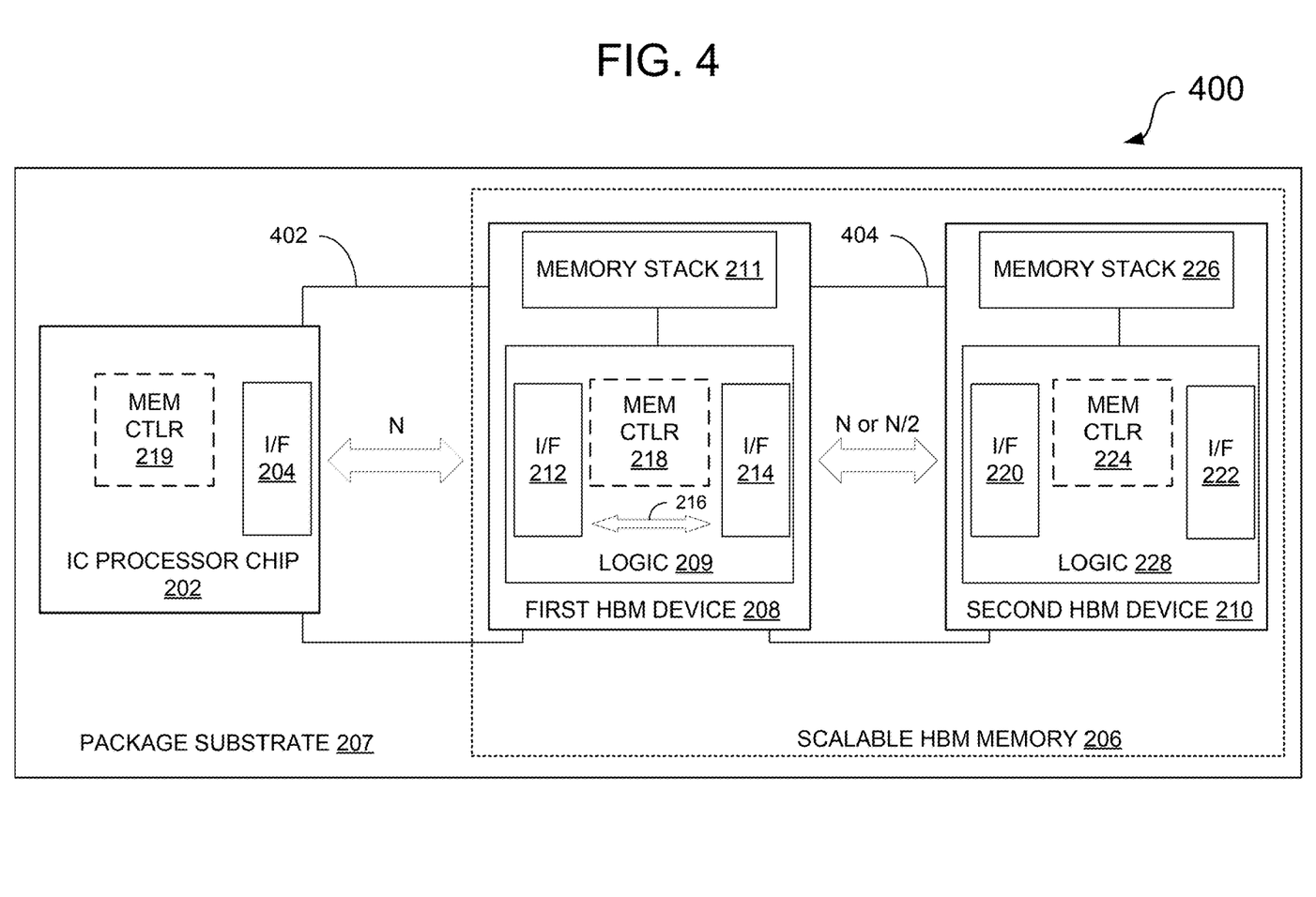
FIG. 4 illustrates an MCM architecture similar to that of FIG. 2, and employing embedded silicon bridges to interconnect various chips.

While the use of standard non-silicon substrates may be beneficial for certain applications, other applications may utilize interface circuitry and associated links that benefit from a silicon-based primary or secondary substrate that is more suitable for fine-pitch routing. FIG. 4 illustrates one embodiment of an MCM 400 that is similar to the MCM 300 of FIG. 2, but incorporating one or more embedded silicon bridges having multiple routing layers, such as first and second embedded multi-die interconnect bridges (EMIBs) 402 and 404. The first bridge 402 spans a first distance between the first IC processor chip 202 and the first HBM device 208 to connect interfaces 204 and 212, while the second bridge 404 spans at least the distance between the first HBM device 208 and the second HBM device 210 to connect interfaces 214 and 220. The use of bridges, instead of one large silicon interposer, enables a high-level of interconnect density where it is needed—between the respective interfaces of multiple chips. For some embodiments, the bridges 402 and 404 may be embedded in a package substrate 207 to reduce costs even further.

Figure 5:
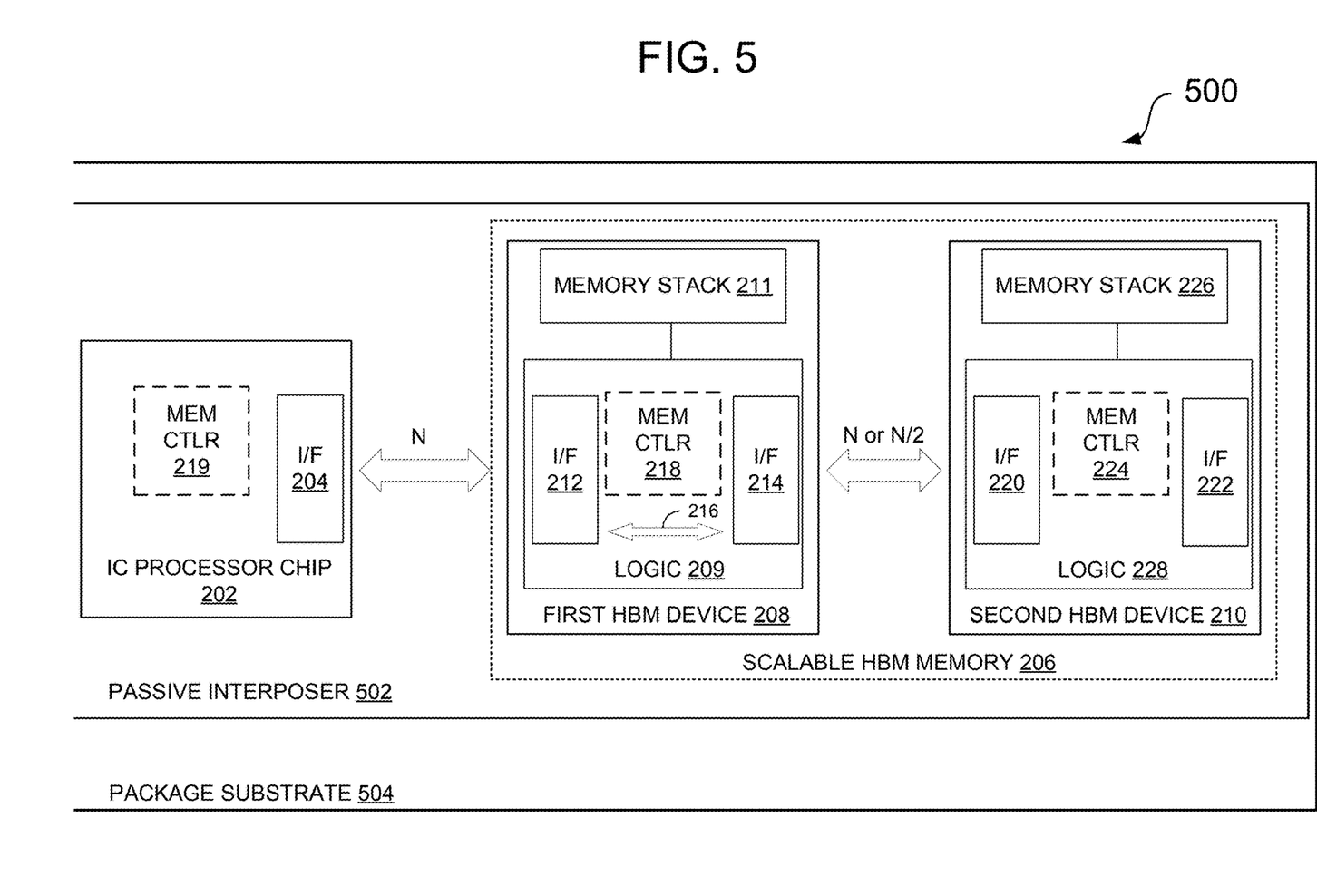
FIG. 5 illustrates an MCM architecture similar to that of FIG. 2, and employing a passive interposer to interconnect various chips.

FIG. 5 illustrates a further embodiment of an MCM 500 that is similar to the MCM 200 of FIG. 2 but incorporates a passive silicon interposer 502 that forms at least a portion of a package substrate 504. Unlike an active interposer, which includes active electronic circuitry, the passive silicon interposer 502 provides a silicon-based support structure formed with finely-pitched interconnect routing paths, and without active transistor circuitry. The use of such an interposer allows for chip contact pitch density for the chip interfaces to be on the order of approximately 30 to 70 micrometers.

Figure 6:
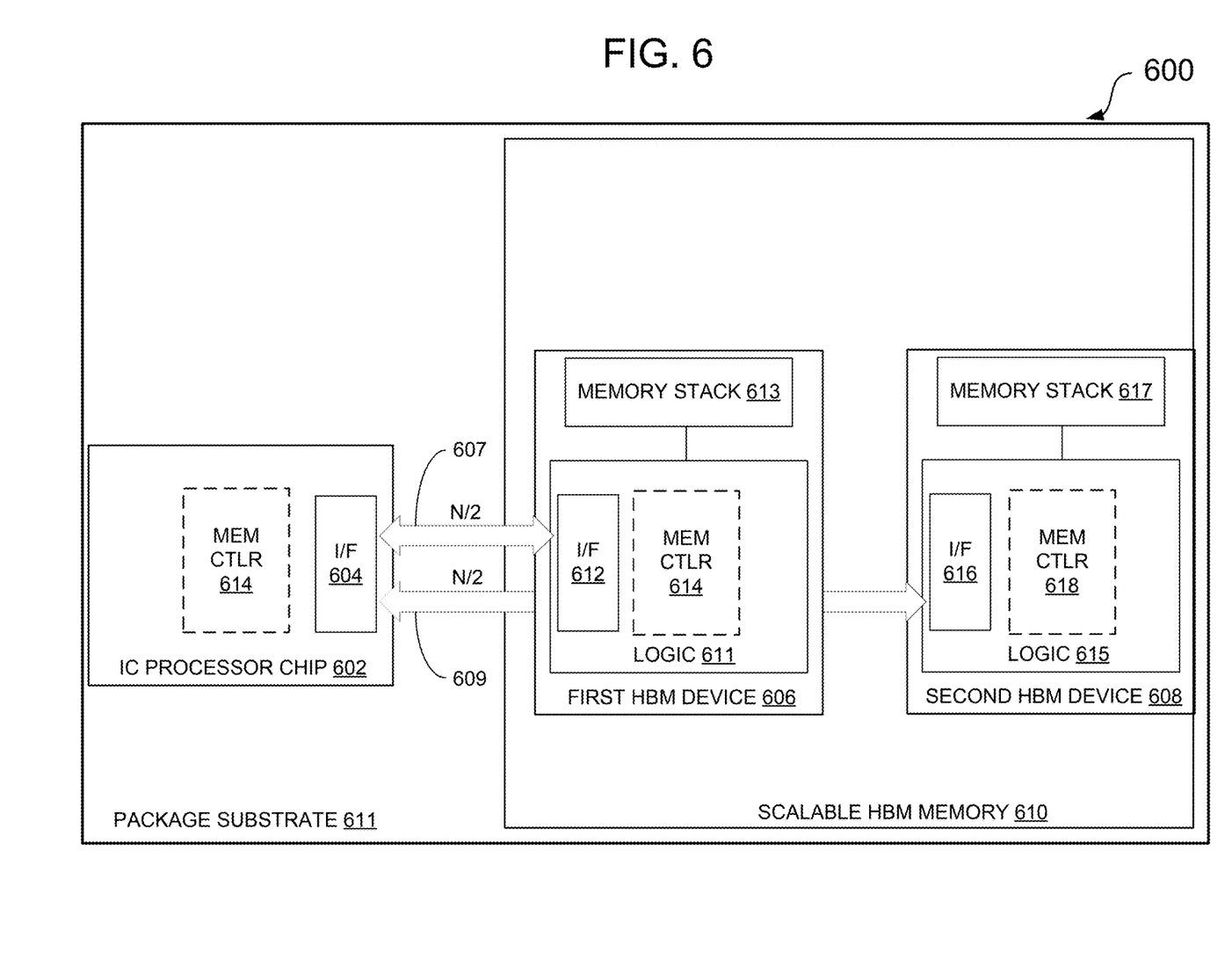
FIG. 6 illustrates another specific embodiment of the MCM of FIG. 1, employing a point-to-point architecture.

While the embodiments illustrated in FIGS. 2-5 illustrate the first and second HBM devices being coupled to the IC processor chip in a daisy-chained architecture, other embodiments may connect each HBM device directly to an IC processor chip in a point-to-point architecture. FIG. 6 illustrates an MCM 600 having an IC processor chip 602 with a host interface 604 formed to support N channels. A first portion of the host interface 604 is directly connected to a first HBM device 606 via a first set of N/2 point-to-point links 607. A second portion of the host interface 604 is directly connected to a second HBM device 608 via a second set of N/2 point-to-point links 609. For one embodiment, a portion of the second set of N/2 links 609 is routed beneath the first HBM device 606. Together, the first and second HBM devices 606 and 608 form a scalable HBM memory 610. In one embodiment, the IC processor chip 602, the first HBM device 606 and the second HBM device 608 are all mounted on a package substrate 611. For some embodiments, all or a portion of the package substrate 611 may be formed of an organic material. In other embodiments, all or a portion of the package substrate 611 may be formed of an active or passive silicon-based material, or include silicon bridge structures such as in FIG. 4.

Further referring to FIG. 6, for one embodiment the first HBM device 606 includes a first logic base die 611 having a first device interface 612 that is directly coupled to the first set of N/2 channels 607. In some embodiments, the first HBM device 606 may also include an on-chip memory controller 614, while in other embodiments the memory controller 614 is disposed in the IC processor chip 602 to control memory accesses for both HBM devices 606 and 608. The first logic base die couples to a first stack of memory chips 613. The second HBM device 608 is formed similar to the first HBM device 606, with a second logic base die 615 having a second device interface 616 that is directly coupled to the second set of N/2 channels 609. The second logic base die 615 couples to a second stack of memory chips 617. For situations where the memory controller 614 is omitted from the IC processor chip 602, the second HBM memory device 608 includes an on-chip memory controller 618 that processes transactions destined for the memory stack 617 associated with it, while the memory controller 614 of the first HBM device 606 processes transactions destined for the memory stack 613 of the first HBM device 606.

In operation, the MCM 600 provides the infrastructure and resources to support operating N independent memory channels with the scalable HBM memory 610 that utilizes HBM devices that separately support N/2 channels, albeit in a point-to-point architecture. One specific example involves providing a total of thirty-two channels—with sixteen of the channels provided by the first HBM device 606 via the first set of N/2 point-to-point links 607 with the IC processor chip 602, and the other sixteen channels provided in a point-to-point manner by the second HBM device 608 via the second set of point-to-point links 609. Additionally, by coordinating memory accesses to the first and second HBM devices 606 and 608 in a concurrent manner, where both of the HBM devices are accessed during respective time intervals that at least partially overlap, the aggregate memory bandwidth of the scalable HBM memory 610 for the thirty-two channels may be doubled in comparison to what the bandwidth would be for sixteen channels.

Figure 7:
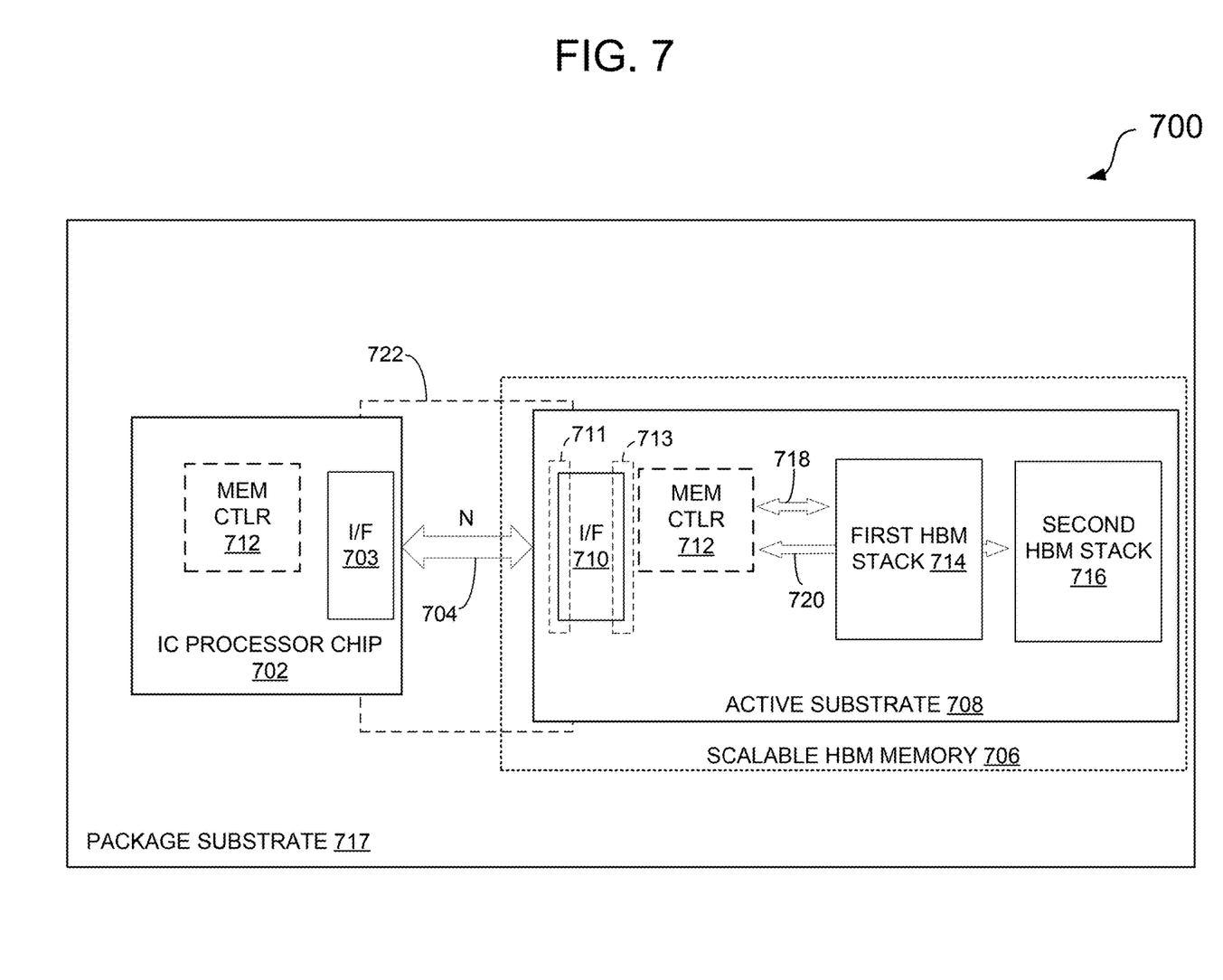
FIG. 7 illustrates an MCM architecture similar to that of FIG. 6, and employing an active interposer to interconnect various chips.

FIG. 7 illustrates a further embodiment for an MCM 700 that employs a point-to-point architecture. The MCM includes an IC processor chip 702 that incorporates a host memory interface 703 to support N memory channels. A full set of N links 704 connects the IC processor chip 702 to a scalable HBM memory 706. For one embodiment, the scalable HBM memory 706 includes an active silicon substrate 708 formed with a device memory interface 710 that supports N channels and which is connected to the N links 704. The device memory interface includes a primary interface 711 for coupling to the host memory interface 703, and a secondary interface 713. For embodiments where a silicon bridge is employed to connect the host interface 703 and the device memory interface 710, each of the interfaces 703 and 710 may be formed with electrical interconnects, such as standard contact bumps or micro-bumps, that engage respective surfaces of a larger substrate 717, such as an organic substrate, a glass substrate, a silicon interposer, a silicon bridge 722, or any combination of the above substrates. For one embodiment, a memory controller 712 is formed on the active substrate 708 to control a first HBM memory stack 714 and a second HBM memory stack 716. Like other embodiments described above, the memory controller 712 may instead be disposed on the IC processor chip 702.

Further referring to FIG. 7, a first set of on-substrate routing paths 718 are formed on the active substrate 708 to connect either the secondary interface 713 of the device memory interface 710 (in the event the memory controller 712 is employed on the IC processor chip 702), or the memory controller 712 to the first HBM memory stack 714 in a point-to-point manner. A second set of on-substrate routing paths 720 are formed on the active substrate 708 to connect either the secondary interface 713 of the device memory interface 710 (in the event the memory controller is employed on the IC processor chip 702), or the memory controller 712 to the second HBM memory stack 716 in a point-to-point manner.

Further referring to FIG. 7, the active silicon substrate 708 essentially functions as a joint HBM base die for the first and second HBM memory stacks 714 and 716. As noted above, for some embodiments, the active silicon substrate 708 may form a secondary substrate for mounting the HBM memory stacks 714 and 716, and formed on or embedded in the larger package substrate 717 that may be constructed of organic material or non-organic material. In other embodiments, and consistent with the description above with respect to FIGS. 1-6, the larger package substrate 717 may include a low-cost non-silicon substrate, a passive interposer or an active silicon interposer, a silicon bridge, a redistribution layer (RDL), a glass substrate, or a combination of the preceding forms, to name but a few.

As is evident from the various embodiments above, the interface circuitry of the IC processor chip, such as interface 703, generally exhibits a consistent beachfront footprint, or dimensional width, regardless of whether the scalable HBM memory 706 employs a single HBM memory device or multiple HBM devices. Maintaining a consistent interface dimensional width may be accomplished through a variety of techniques, including increasing the data rate per bump or trace, and/or increasing the trace density of the interface circuitry. Additionally, the various embodiments illustrated in FIGS. 1-7 and described above generally provide for an inline arrangement of multiple HBM devices with respect to the device memory interface circuitry. For one embodiment, the dimensional width of the host interface circuitry 703 is substantially the same as the dimensional width of each HBM memory stack, and for one embodiment may correspond to the dimensional width of each HBM stack with as much as a +/−ten percent tolerance while still providing the positional efficiencies described herein. As a result, the scalable HBM memory 706 maybe scaled to expand capacity and bandwidth to support the memory needs of the IC processor chip 702 without the need to correspondingly increase the beachfront size of the interface circuitry 703 disposed on the limited area of the IC processor chip 702.

Figure 8:
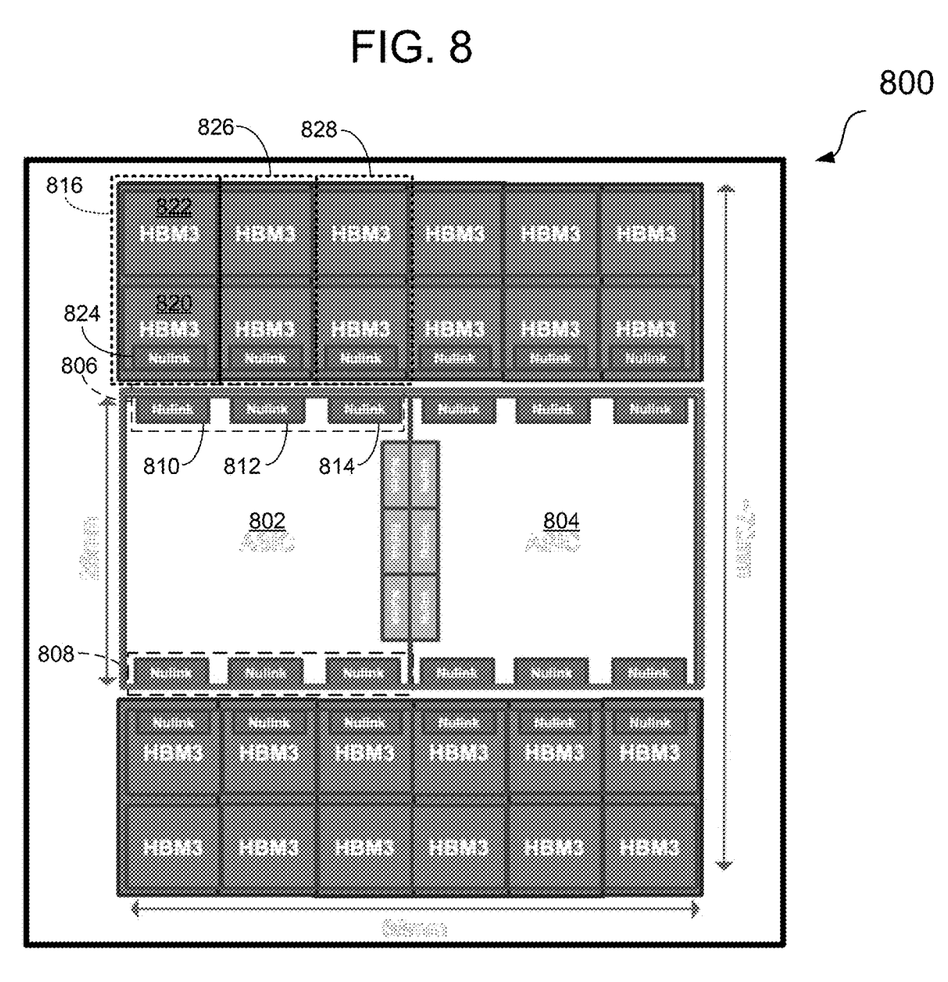
FIG. 8 illustrates an MCM architecture that expands memory capacity and/or bandwidth resources for multiple processors using techniques shown in FIGS. 1-7.

FIG. 8 illustrates a multi-chip module (MCM), generally designated 800, that takes advantage of the uniform beachfront feature shown in the various embodiments of FIGS. 1-7 to allow for a significant expansion of the memory capacity and bandwidth resources available for MCM processor chips 802 and 804. For one embodiment, the first processor chip 802 includes respective first and second memory interface beachfronts 806 and 808. The first memory interface beachfront 806 employs multiple independent memory interfaces 810, 812 and 814 on a "north" edge of the first processor chip 802. The second memory interface beachfront 808 is formed similarly, albeit on a "south" edge of the first processor chip 802.

Further referring to FIG. 8, for one embodiment, each of the multiple independent host memory interfaces 810, 812 and 814 generally corresponds to the host memory interface circuitry shown in any of the embodiments of FIGS. 1-7. While the structures shown in FIG. 8 are not intended to be exactly to scale, it is evident that only a limited number of host interface circuits of a given design can fit within the narrow memory interface beachfront footprint. For one embodiment, each independent host memory interface, such as 810, couples to a scalable HBM memory 816, which may take the form of any of the scalable HBM memory embodiments disclosed above with respect to FIGS. 1-7. For one embodiment, the scalable HBM memory 816 includes a set of inline legacy HBM memory devices 820 and 822 and a memory device interface 824 that may be configured topologically in any of the various ways shown in FIGS. 1-7 and described above. By positioning the first HBM device 820, the second HBM device 822, and the memory device interface 824 in an inline manner, and uniformly maintaining the host memory interface circuitry 810 and memory device interface 824 to a consistent footprint that is substantially the same as the beachfront of the HBM memory devices 820 and 822, regardless of whether one or more HBM devices are employed, a significant capacity and memory bandwidth expansion may be carried out for the processor chips 802 and 804 over their existing chip beachfronts.

Further referring to FIG. 8, the remaining host memory interfaces 812 and 814 are also coupled to respective scalable HBM memories 826 and 828 in a similar fashion as that described above. The architecture is further scaled in a similar manner to the "south" beachfront 808 for the first processor 802. The second processor 804 includes similar beachfronts and host memory interfaces as that described for the first processor 802, and is coupled to similar scalable HBM memories.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present disclosure. In some instances, the terminology and symbols may imply specific details that are not required to practice embodiments of the disclosure. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While aspects of the disclosure have been described with reference to specific embodiments thereof, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A scalable high-bandwidth memory (HBM), comprising:
   an active silicon substrate;
   a memory interface circuit configured to couple to N memory channels, the memory interface circuit comprising a primary interface to couple to a host memory interface via the N memory channels, the primary interface configured to exhibit a first dimensional width that corresponds to a dimensional width of the host memory interface;
   a first HBM stack of memory die disposed on the active silicon substrate and coupled to a secondary interface of the memory interface circuit, the first HBM stack of memory die dedicated to a first subset of the N memory channels and operative at a first data transfer rate;
   a second HBM stack of memory die disposed on the active silicon substrate, the second HBM stack of memory die positioned inline with the first HBM stack of memory die and the memory interface circuit, the second HBM stack of memory die coupled to the secondary interface of the memory interface circuit, the second HBM stack of memory die dedicated to a second subset of the N memory channels and operative at a second data transfer rate; and
   wherein the first HBM stack of memory die and the second HBM stack of memory die are configured to collectively couple to the N memory channels and to exhibit an aggregate data transfer rate that is a sum of the first data transfer rate and the second data transfer rate.

2. The scalable HBM of claim 1, wherein:
   the active silicon substrate includes an electrical interconnect to interface the memory interface circuit to a silicon bridge.

3. The scalable HBM of claim 1, wherein:
   the active silicon substrate comprises an electrical interconnect to interface the memory interface circuit to at least one of an organic substrate, a silicon interposer, a glass substrate, a passive interposer or a redistribution layer.

4. The scalable HBM of claim 1, wherein:
   the first HBM stack of memory die and the second HBM stack of memory die are disposed in a point-to-point configuration with respect to the memory interface circuit.

5. The scalable HBM of claim 1, further comprising:
   memory control circuitry disposed on the active silicon substrate to control transfers between the memory interface circuit and the first HBM stack of memory die and the second HBM stack of memory die.

6. The scalable HBM of claim 1, wherein:
   at least one of the first HBM stack of memory die and the second HBM stack of memory die includes multiple dynamic random access memory (DRAM) die.

7. The scalable HBM of claim 1, wherein:
   the active silicon substrate includes active circuitry to form a shared logic base die for the first HBM stack of memory die and the second HBM stack of memory die.

8. The scalable HBM of claim 1, wherein:
   the first HBM stack of memory die exhibits a second dimensional width;
   the second HBM stack of memory die exhibits the second dimensional width; and
   the first dimensional width of the primary interface corresponds to the second dimensional width of the first HBM stack of memory die and the second HBM stack of memory die.

9. A multi-chip module (MCM), comprising:
   a package substrate;
   a processor chip comprising a host memory interface to couple to N memory channels; and
   a scalable high-bandwidth memory (HBM) coupled to the processor chip, the scalable HBM including
      an active silicon substrate disposed on the package substrate;
      a memory interface circuit configured to couple to the N memory channels, the memory interface circuit comprising a primary interface to couple to a host memory interface via the N memory channels and a secondary interface, the primary interface configured to exhibit a first dimensional width that corresponds to a dimensional width of the host memory interface;
      a first HBM stack of memory die disposed on the active silicon substrate and coupled to the secondary interface of the memory interface circuit, the first HBM stack of memory die dedicated to a first subset of the N memory channels and operative at a first data transfer rate;
      a second HBM stack of memory die disposed on the active silicon substrate, the second HBM stack of memory die positioned inline with the first HBM stack of memory die and the memory interface circuit, the second HBM stack of memory die coupled to the secondary interface of the memory interface circuit, the second HBM stack of memory die dedicated to a second subset of the N memory channels and operative at a second data transfer rate; and
      wherein the first HBM stack of memory die and the second HBM stack of memory die are configured to collectively couple to the N memory channels and exhibit an aggregate data transfer rate that is a sum of the first data transfer rate and the second data transfer rate.

10. The MCM of claim 9, wherein:
    the package substrate comprises an organic substrate.

11. The MCM of claim 9, wherein:
    the host memory interface comprises a first electrical interconnect;
    the primary interface of the memory interface circuit comprises a second electrical interconnect; and
    wherein the MCM further comprises a silicon bridge disposed on the package substrate and coupled to the first electrical interconnect and the second electrical interconnect.

12. The MCM of claim 9, wherein:
    the first HBM stack of memory die and the second HBM stack of memory die are disposed in a point-to-point configuration with respect to the memory interface circuit.

13. The MCM of claim 9, wherein:
    at least one of the first HBM stack of memory die and the second HBM stack of memory die includes multiple dynamic random access memory (DRAM) die.

14. The MCM of claim 9, wherein:
    the active silicon substrate includes active circuitry to form a shared logic base die for the first HBM stack of memory die and the second HBM stack of memory die.

15. The MCM of claim 9, wherein:
the first HBM stack of memory die exhibits a second dimensional width;
the second HBM stack of memory die exhibits the second dimensional width; and
the first dimensional width of the primary interface corresponds to the second dimensional width of the first HBM stack of memory die and the second HBM stack of memory die.

16. A multi-chip module (MCM), comprising:
a package substrate;
processor circuitry comprising multiple independent host memory interfaces, each of the multiple independent host memory interfaces configured to couple to N memory channels; and
a scalable high-bandwidth memory (HBM) coupled to the processor circuitry, the scalable HBM including multiple HBM memory slices, each of the multiple HBM memory slices comprising
an active silicon substrate disposed on the package substrate;
a memory interface circuit configured to couple to the N memory channels, the memory interface circuit having a primary interface to couple to one of the multiple host memory interfaces via the N memory channels, the primary interface configured to exhibit a first dimensional width that corresponds to a dimensional width of the host memory interface, the memory interface circuit comprising a secondary interface;
a first HBM stack of memory die disposed on the active silicon substrate and coupled to the secondary interface of the memory interface circuit, the first HBM stack of memory die dedicated to a first subset of the N memory channels and operative at a first data transfer rate;
a second HBM stack of memory die disposed on the active silicon substrate, the second HBM stack of memory die positioned inline with the first HBM stack of memory die and the one of the multiple host memory interfaces, the second HBM stack of memory die coupled to the secondary interface of the memory interface circuit, the second HBM stack of memory die dedicated to a second subset of the N memory channels and operative at a second data transfer rate; and
wherein the first HBM stack of memory die and the second HBM stack of memory die are configured to collectively couple to the N memory channels and exhibit an aggregate data transfer rate that is a sum of the first data transfer rate and the second data transfer rate.

17. The MCM of claim 16, wherein the processor circuitry comprises:
a first processor comprising a first subset of the multiple independent host memory interfaces disposed in a first chip beachfront edge of the first processor, the first processor comprising a second subset of the multiple independent host memory interfaces disposed in a second chip beachfront edge of the first processor that is positioned opposite the first chip beachfront edge of the first processor; and
a second processor disposed adjacent the first processor and comprising a third subset of the multiple independent host memory interfaces disposed in a third chip beachfront edge of the second processor, the second processor comprising a fourth subset of the multiple independent host memory interfaces disposed in a fourth chip beachfront edge of the second processor that is positioned opposite the first chip beachfront edge of the first processor.

18. The MCM of claim 17, wherein the multiple memory slices of the scalable HBM memory comprise:
a first subset of the multiple memory slices to couple to the first chip beachfront edge of the first processor and the third chip beachfront edge of the second processor; and
a second subset of the multiple memory slices to couple to the second chip beachfront edge of the first processor and the fourth chip beachfront edge of the second processor.

19. The MCM of claim 16, wherein:
the active silicon substrate is coupled to the processor circuitry via at least one silicon bridge.

* * * * *